United States Patent
Chang et al.

(10) Patent No.: US 8,587,090 B2
(45) Date of Patent: Nov. 19, 2013

(54) DIE SEAL RING STRUCTURE

(75) Inventors: Tien-Chang Chang, Hsinchu (TW); Yu-Hua Huang, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 11 days.

(21) Appl. No.: 13/477,746

(22) Filed: May 22, 2012

(65) Prior Publication Data
US 2013/0026718 A1    Jan. 31, 2013

Related U.S. Application Data

(60) Provisional application No. 61/513,117, filed on Jul. 29, 2011.

(51) Int. Cl.
*H01L 23/544* (2006.01)
(52) U.S. Cl.
USPC ............. 257/620; 257/758; 257/E23.179
(58) Field of Classification Search
USPC ............... 257/E23.179, 620, 758, 127
See application file for complete search history.

(56) References Cited

U.S. PATENT DOCUMENTS

| | | | |
|---|---|---|---|
| 6,753,608 B2* | 6/2004 | Tomita ..................... | 257/758 |
| 8,247,876 B2* | 8/2012 | Tsutsue et al. ............ | 257/409 |
| 2007/0090447 A1* | 4/2007 | Morimoto et al. ........ | 257/316 |
| 2008/0081458 A1* | 4/2008 | Lin et al. .................. | 438/620 |
| 2009/0115024 A1 | 5/2009 | Jeng et al. | |
| 2009/0321890 A1 | 12/2009 | Jeng et al. | |
| 2010/0308464 A1* | 12/2010 | Tsutsue et al. ........... | 257/758 |
| 2012/0175728 A1* | 7/2012 | Yang et al. ............... | 257/508 |
| 2012/0313217 A1* | 12/2012 | Hung et al. .............. | 257/532 |

* cited by examiner

*Primary Examiner* — Thanh Nguyen
(74) *Attorney, Agent, or Firm* — McClure, Qualey & Rodack, LLP

(57) ABSTRACT

The invention provides a die seal ring structure. The die seal ring structure includes an inner seal ring portion surrounding an integrated circuit region. An outer seal ring portion is surrounded by a scribe line, surrounding the inner seal ring portion, wherein the outer seal ring portion has an outer top metal layer pattern with a first width extending over the inner seal ring portion and connecting to an inner next-to-top metal layer pattern of the inner seal ring portion. A first redistribution pattern is disposed on the outer top metal layer pattern, having a second width which is narrower than the first width. A second redistribution pattern is disposed on the first redistribution pattern. A redistribution passivation layer covers the second redistribution pattern and the inner seal ring portion, wherein the redistribution passivation layer is separated from the scribe line by a second distance.

22 Claims, 1 Drawing Sheet

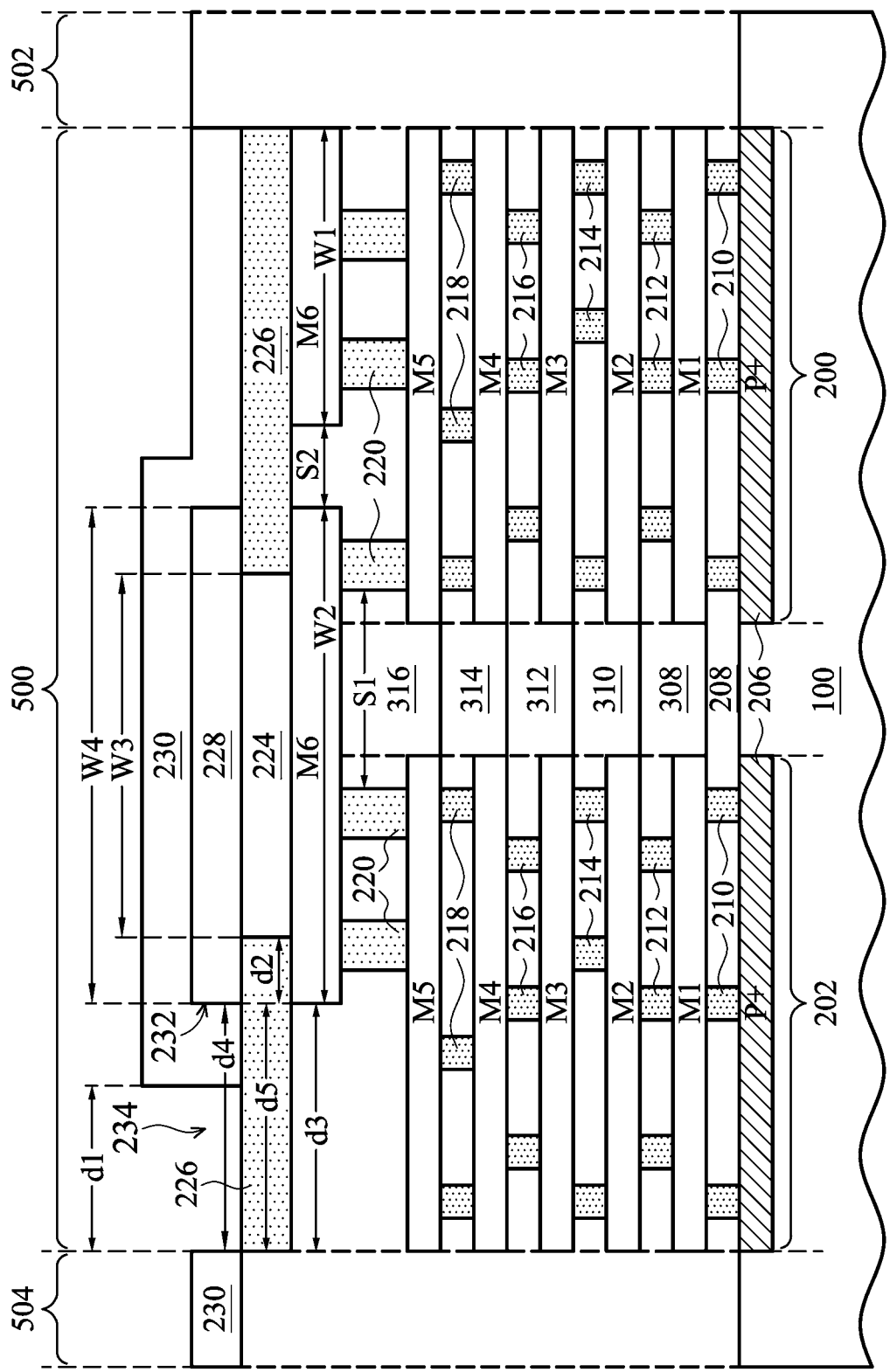

DIE SEAL RING STRUCTURE

CROSS REFERENCE TO RELATED APPLICATIONS

This application claims the benefit of U.S. Provisional Application No. 61/513,117 filed Jul. 29, 2011, the entirety of which is incorporated by reference herein.

BACKGROUND OF THE INVENTION

1. Field of the Invention

The present invention relates to a die seal ring structure, and in particular, to a die seal ring structure having a crack stop function without attachment of a metal layer thereto.

2. Description of the Related Art

A die seal ring is generally formed between scribe lines and a periphery region of integrated circuits of each die of a wafer, composed by alternatively laminating dielectric layers and metal layers, which interconnect by vias through the dielectric layers. When a wafer dicing process is performed along the scribe lines, the die seal ring can block unintended stress cracks from the scribe lines to the integrated circuits produced by the wafer dicing process. Also, the die seal ring can block moisture penetration or chemical damage like acid, alkaline containing or diffusion of contaminating species. In the current semiconductor technology, a double die seal ring structure has been developed to solve the more significant problem of cracks. However, the top-most layer has a poor crack stop function due to further scaling of the semiconductor device and demand for smaller dimensions and increased functions of consumer products.

Thus, a novel die seal ring structure with a good crack stop function is desirable.

BRIEF SUMMARY OF INVENTION

A die seal ring structure is provided. An exemplary embodiment of a seal ring structure comprises an inner seal ring portion surrounding an integrated circuit region. An outer seal ring portion is surrounded by a scribe line, surrounding the inner seal ring portion, wherein the outer seal ring portion has an outer top metal layer pattern with a first width extending over the inner seal ring portion and connecting to an inner next-to-top metal layer pattern of the inner seal ring portion. A first redistribution pattern is disposed on the outer top metal layer pattern, having a second width which is narrower than the first width. A second redistribution pattern is disposed on the first redistribution pattern, wherein the first redistribution pattern has a third width which is the same as that of the first width. A redistribution passivation layer covers the second redistribution pattern and the inner seal ring portion, wherein the redistribution passivation layer is separated from the scribe line by a second distance.

Another exemplary embodiment of a die seal ring structure comprises an inner seal ring portion surrounding an integrated circuit region. An outer seal ring portion is surrounded by a scribe line, surrounding the inner seal ring portion, wherein the outer seal ring portion has an outer top metal layer pattern. A first redistribution pattern is disposed on the outer top metal layer pattern. A second redistribution pattern is disposed on the first redistribution pattern on the first redistribution pattern, wherein the outer top metal layer pattern, and the first and second redistribution patterns overlap with both the inner and outer seal ring portions. A redistribution passivation layer covers the second redistribution pattern and the inner seal ring portion, wherein all of the outer top metal layer pattern, and the first and second redistribution patterns and the redistribution passivation layer are separated from the scribe line.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIG. 1 is a cross section of one exemplary embodiment of a die seal ring structure 500 of the invention.

DETAILED DESCRIPTION OF INVENTION

The following description is a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice the invention.

FIG. 1 is a cross section of one exemplary embodiment of a die seal ring structure 500 of the invention. As shown in FIG. 1, the die seal ring structure 500 is positioned between an integrated circuit region 502 and a scribe line 504 of a semiconductor substrate 100. The die seal ring structure 500 comprises an inner seal ring portion 200 and an outer seal ring portion 202. The inner seal ring portion 200 surrounds the integrated circuit region 502, and the outer seal ring portion 202 surrounds the inner seal ring portion 200. Also, the outer seal ring portion 202 is surrounded by the scribe line 504. In this embodiment, the semiconductor substrate 100 may be a p-type semiconductor substrate. The inner seal ring portion 200 and the outer seal ring portion 202 have p+ diffusion regions 206 on a top of the semiconductor substrate 100, respectively. The inner seal ring portion 200 and the outer seal ring portion 202 both comprise a plurality of dielectric layers 208, 308, 310, 312, 314 and 316 laminated vertically. The dielectric layers 208, 308, 310, 312, 314 and 316 are respectively covered by metal layer patterns M1, M2, M3, M4, M5 and M6, from bottom to top. The metal layer patterns M1, M2, M3, M4, M5 and M6 are designed as close-loop patterns. The number of the metal layer patterns is defined by the costumer design for the integrated circuit region 502 and the scope of the invention is not limited. In the inner seal ring portion 200, the metal layer pattern M1 is coupled to the p+ diffusion regions 206a by vias 210 through the dielectric layer 208 between the metal layer pattern M1 and the p+ diffusion regions 206. The metal layer pattern M2 is coupled to the metal layer pattern M1 by vias 212 through the dielectric layer 308 between the metal layer pattern M1 and the metal layer pattern M2. The metal layer pattern M3 is coupled to the metal layer pattern M2 by vias 214 through the dielectric layer 310 between the metal layer pattern M2 and the metal layer pattern M3. The metal layer pattern M4 is coupled to the metal layer pattern M3 by vias 216 through the dielectric layer 312 between the metal layer pattern M3 and the metal layer pattern M4. The metal layer pattern M5 is coupled to the metal layer pattern M4 by vias 218 through the dielectric layer 314 between the metal layer pattern M4 and the metal layer pattern M5. The metal layer pattern M6 is coupled to the metal layer pattern M5 by vias 220 through the dielectric layer 316 between the metal layer pattern M5 and the metal layer pattern M6. The metal layer pattern M6 is also referred to as a top metal layer pattern M6. The metal layer pattern M5 is also referred to as a next-to-top metal layer pattern M5, and so on. It is noted that the inner seal ring portion 200 and the outer seal ring portion 202 have a similarly structure except for the top metal layer pattern M6. The metal layer patterns M1, M2, M3, M4, and M5 of the inner seal ring portion 200 are respectively isolated from the widths of the outer seal ring portion 202 by a distance S1. Also, the top metal layer pattern M6 of the outer seal ring portion 202 is designed to shift toward the inner seal ring portion 200, extruding through the gap 222 between the inner seal ring portion 200 and the outer seal ring portion 202. That is to say, the top metal layer pattern M6 of the outer seal ring portion 202 extends over the inner seal ring portion 200 and connects to the next-to-top metal layer pattern M5 of the inner seal ring portion 200 through the via 220. The top metal layer pattern M6 of the outer seal ring portion 202 is separated from the scribe line 504 by a distance d3. The top metal layer pattern M6 of the inner seal ring portion 200 has a width W1, which is designed to be narrower than a width W2 of the top metal layer pattern M6 of the outer seal ring portion 202. Also, the distance S1 is larger than the distance S2 between the top metal layer pattern M6 of the inner seal ring portion 200 and the top metal layer pattern M6 of the outer seal ring portion 202.

A passivation layer 226 is formed covering the inner top metal layer pattern 200 and the outer top metal layer pattern 202. The first redistribution pattern 224 is formed through the passivation layer 226 by a photolithography and deposition process. As shown in FIG. 1, the first redistribution pattern 224 is formed on the outer top metal layer pattern 202. In this embodiment, the first redistribution pattern 224 is also referred to as a TerMinal Via for Redistribution Layer (TMV_RDL) pattern 224. A second redistribution pattern 228 is formed on the first redistribution pattern on the first redistribution pattern 224 by a plating process. In this embodiment, the second redistribution pattern 228 is also referred to as an aluminum (Al) redistribution layer (AL_RDL) pattern 228. In this embodiment, the second redistribution pattern 228 and pads (not shown) are formed by patterning the same layer formed of aluminum (Al). The AL_RDL pattern 228 electrically connects to the top metal layer pattern M6 of the outer seal ring portion 202 through the TMV_RDL pattern 224. In one embodiment, the TMV_RDL pattern 224 has a width W3 smaller than the width W2 of the top metal layer pattern M6 of the outer seal ring portion 202 but larger than the width W1 of the top metal layer pattern M6 of the inner seal ring portion 200. In one embodiment, the AL_RDL pattern 228 has a width W4 the same as the width W2 of the top metal layer pattern M6 of the outer seal ring portion 202. Also, the TMV_RDL pattern 224 is disposed centrally of the top metal layer pattern M6 of the outer seal ring portion 202. Therefore, edges of the top metal layer pattern M6 of the outer seal ring portion 202 is recessed from edges of the top metal layer pattern M6 of the outer seal ring portion 202 adjacent thereto. That is to say, the edge of the TMV_RDL pattern 224 to the edge of the top metal layer pattern M6 of the outer seal ring portion 202 is adjacent thereto by a distance d2. In one embodiment, edges 232 of the AL_RDL pattern 228 adjacent to the scribe line 504 is aligned to that of the top metal layer pattern M6 of the outer seal ring portion 202. That is to say, the outer top metal layer pattern M6 fully overlaps with the AL_RDL pattern 228. Further, the AL_RDL pattern 228 is separated from the scribe line 504 by a distance d4 which is the same as that of the distance d3, and the TMV_RDL pattern 224 is separated from the scribe line 504 by a distance d5 larger than the distances d3 and d4.

Still refer to FIG. 1, a redistribution passivation layer 230 is formed covering the AL_RDL pattern 228 and the inner seal ring portion 200. It is noted that the redistribution passivation layer 230 also wraps vertical edges 232 of the redistribution passivation layer 230. The passivation layer 226 and the redistribution passivation layer 230 overlap with both the inner and outer seal ring portions 200 and 202. As shown in FIG. 1, the top metal layer pattern M6 of the outer seal ring portion 202, the TMV_RDL pattern 224, the AL_RDL pattern 228 and the redistribution passivation layer 230 are designed separated from the scribe line 504, thereby allowing a gap 234 which is disposed to separate the redistribution passivation layer 230 from the scribe line 504. In one embodiment, the gap 234 has a width d1 (also referred to as a distance d1 between the redistribution passivation layer 230 and the scribe line 504), and a portion of the passivation layer 226 is exposed to the gap 234. In one embodiment, the width d1 is designed smaller than the distance d3 between the scribe line 504 and the top metal layer pattern M6 of the outer seal ring portion 202, the distance d4 between the scribe line 504 and the AL_RDL pattern 228 and the distance d5 between the scribe line 504 and the TMV_RDL pattern 224. After performing the aforementioned process, one exemplary embodiment of a die seal ring structure 500 of the invention is completely formed.

One exemplary embodiment of a die seal ring structure 500 of the invention has the following advantages. The top metal layer pattern M6 of the outer seal ring portion 202, the first redistribution pattern 224, the second redistribution pattern 232 and the redistribution passivation layer 230 are designed to shift toward the inner seal ring portion 200, allowing a gap 234 to be disposed to separate the redistribution passivation layer 230 from the scribe line 504 without exposing any metal layers. The gap 234 can provide a crack stop function for the die seal ring structure 500 during the wafer dicing process. The die seal ring structure 500 with the gap 234 can avoid attacking? the metal layer patterns (including redistribution layer patterns and metal layer patterns of the inner and outer seal ring portions) during the subsequence pad cleaning process using the acid based salvation. Also, the gap 234 is designed to provide enough guard band (enough large distance d6 between a bottom of the gap 234 and the underlying metal layer pattern M5 of the outer seal ring portion 202) for over-etching of the pad cleaning process, if it happens.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A die seal ring structure, comprising:
an inner seal ring portion surrounding an integrated circuit region;
an outer seal ring portion surrounded by a scribe line, surrounding the inner seal ring portion, wherein the outer seal ring portion has an outer top metal layer pattern with a first width extending over the inner seal ring portion and connecting to an inner next-to-top metal layer pattern of the inner seal ring portion;
a first redistribution pattern on the outer top metal layer pattern, having a second width which is narrower than the first width;
a second redistribution pattern on the first redistribution pattern; and
a redistribution passivation layer covering the second redistribution pattern and the inner seal ring portion, wherein the redistribution passivation layer is separated from the scribe line by a second distance.

2. The die seal ring structure as claimed in claim 1, wherein the second redistribution pattern has a third width which is the same as that of the first width.

3. The die seal ring structure as claimed in claim 1, wherein the inner seal ring portion has an inner top metal layer pattern having a fourth width which is narrower than the first width.

4. The die seal ring structure as claimed in claim 3, further comprising a passivation layer covering the inner top metal layer pattern and the outer top metal layer pattern, wherein the first redistribution pattern is formed through the passivation layer.

5. The die seal ring structure as claimed in claim 1, wherein an edge of the first redistribution pattern to an edge of the outer top metal layer pattern adjacent thereto is separated by a second distance.

6. The die seal ring structure as claimed in claim 1, wherein the outer top metal layer pattern is separated from the scribe line by a third distance.

7. The die seal ring structure as claimed in claim 6, wherein the first distance is smaller than third distance.

8. The die seal ring structure as claimed in claim 1, wherein an edge of the second redistribution pattern adjacent to the scribe line is aligned to an edge of the outer top metal layer pattern adjacent to the scribe line.

9. The die seal ring structure as claimed in claim 3, wherein a portion of the passivation layer is exposed from the redistribution passivation layer.

10. The die seal ring structure as claimed in claim 1, wherein the first and second redistribution patterns overlap with both the inner and outer seal ring portions.

11. The die seal ring structure as claimed in claim 3, wherein the outer top metal layer pattern and the inner top metal layer pattern are at the same level, and the outer top metal layer pattern is separated from the inner top metal layer pattern by a fourth distance.

12. The die seal ring structure as claimed in claim 11, wherein the outer seal ring portion has an outer next-to-top metal layer pattern separated from the inner next-to-top metal layer pattern by a fifth distance larger than the fourth distance.

13. A die seal ring structure, comprising:
an inner seal ring portion surrounding an integrated circuit region;
an outer seal ring portion surrounded by a scribe line, surrounding the inner seal ring portion, wherein the outer seal ring portion has an outer top metal layer pattern;
a first redistribution pattern on the outer top metal layer pattern;
a second redistribution pattern on the first redistribution pattern, wherein the outer top metal layer pattern, and the first and second redistribution patterns overlap with both the inner and outer seal ring portions; and
a redistribution passivation layer covering the second redistribution pattern and the inner seal ring portion, wherein all of the outer top metal layer pattern, and the first and second redistribution patterns and the redistribution passivation layer are separated from the scribe line.

14. The die seal ring structure as claimed in claim 13, wherein the outer top metal layer pattern fully overlaps with the second redistribution pattern.

15. The die seal ring structure as claimed in claim 13, wherein a width of the first redistribution pattern is narrower than the widths of the outer top metal layer pattern and the second redistribution pattern.

16. The die seal ring structure as claimed in claim 13, wherein the first redistribution pattern is fully covered by the second redistribution pattern.

17. The die seal ring structure as claimed in claim 13, wherein the redistribution passivation layer is separated from the scribe line by a gap having a width, and the width is smaller than a first distance between the outer top metal layer pattern and the scribe line.

18. The die seal ring structure as claimed in claim 17, wherein a second distance between the first redistribution pattern and the scribe line is smaller than the first distance.

19. The die seal ring structure as claimed in claim 17, wherein the second redistribution pattern is separated from the scribe line by a third distance, wherein the third distance is the same as the first distance.

20. The die seal ring structure as claimed in claim 13, wherein the outer top metal layer pattern and the second redistribution pattern have the same width.

21. The die seal ring structure as claimed in claim 13, wherein the inner seal ring portion has an inner top metal layer pattern with a width which is narrower than the outer top metal layer pattern.

22. The die seal ring structure as claimed in claim 19, further comprising a passivation layer covering the inner top metal layer pattern and the outer top metal layer pattern, wherein the first redistribution pattern is formed through the passivation layer.

* * * * *